US005246487A

United States Patent [19]

Oguri

[11] Patent Number: 5,246,487

[45] Date of Patent: Sep. 21, 1993

[54] MUSICAL TONE CONTROL APPARATUS WITH NON-LINEAR TABLE DISPLAY

[75] Inventor: Shigenori Oguri, Hamamatsu, Japan

[73] Assignee: Yamaha Corporation, Hamamatsu, Japan

[21] Appl. No.: 675,550

[22] Filed: Mar. 25, 1991

[30] Foreign Application Priority Data

Mar. 26, 1990 [JP] Japan ........................ 2-73541

[51] Int. Cl.[5] .................. G10H 7/00; G11C 00/00

[52] U.S. Cl. .............................. 84/607; 84/622; 84/630

[58] Field of Search ...................... 84/600-604, 84/607, 622, 623, 626, 630, 659

[56] References Cited

U.S. PATENT DOCUMENTS

| | | | |
|---|---|---|---|
| 4,622,877 | 11/1986 | Strong | 84/622 X |
| 4,649,783 | 3/1987 | Strong et al. | 84/622 X |
| 4,868,869 | 9/1989 | Kramer | 84/622 |
| 4,984,276 | 1/1991 | Smith | 84/630 X |
| 4,991,218 | 2/1991 | Kramer | 84/622 X |
| 5,027,689 | 7/1991 | Fujimori | 84/622 |
| 5,113,743 | 5/1992 | Higashi | 84/622 |
| 5,117,729 | 6/1992 | Kunimoto | 84/660 |

FOREIGN PATENT DOCUMENTS 0248527 4/1987 European Pat. Off. .

*Primary Examiner*—William M. Shoop, Jr.
*Assistant Examiner*—Jeffrey W. Donels
*Attorney, Agent, or Firm*—Graham & James

[57] ABSTRACT

A musical tone control apparatus includes a sound source having a delay feedback synthesis circuit for forming musical tone signal by performing arithmetic processing of musical tone control data on the basis of a nonlinear table, a coordinate designation device capable of designating an arbitrary position and outputting a coordinate position corresponding to the designated position, a coordinate display device for displaying the coordinate position outputted by the coordinate designation device, and a table forming unit for forming the nonlinear table on the basis of the coordinate position outputted by the coordinate designation device.

5 Claims, 7 Drawing Sheets

MAIN ROUTINE

MUSICAL TONE CONTROL APPARATUS WITH NON-LINEAR TABLE DISPLAY

BACKGROUND OF THE INVENTION

1. Field of the Invention

The present invention relates to a musical tone control apparatus for an electronic musical instrument and, more particularly, to an apparatus for forming a nonlinear table to control a generation of musical tone in a sound source means comprising a delay feedback synthesis circuit for processing musical tone control data on the basis of a nonlinear table.

2. Description of the Prior Art

In an electronic musical instrument, arithmetic processing of a musical tone signal having a predetermined tone color, pitch, tone volume, or vibrato is performed by a sound source circuit on the basis of control input data to generate an electronic tone simulating that of an acoustic instrument, and the electronic tone is produced form a sound system.

As a conventional sound source circuit, a sound source using a so-called delay feedback type decay tone algorithm for inputting a nonlinear signal in a delay loop system including a delay circuit, and performing feedback arithmetic processing of the nonlinear signal to form a musical tone waveform signal is known (Japanese Patent Laid-Open Gezette No. Sho 63- 40199).

In an electronic tone forming apparatus using a delay feed back type musical tone waveform signal, a mechanical vibration system of an acoustic instrument such as a string of a bowed instrument and a tube of a wind instrument is physically simulated by an electrical circuit, and a nonlinear signal corresponding to movement of a contact between a bow or a string of a bowed instrument, or a reed or embouchure of a wind instrument, or a hammer of a percussion, a piano, or the like need only be inputted to the delay loop system, so that a tone of the wind instrument, the bowed instrument, or the percussion including a change in intensity level can be naturally and faithfully synthesized.

In the sound source as the electronic tone forming apparatus, nonlinear functions for obtaining nonlinear signals are stored in advance in, e.g., a ROM as a table, and a control circuit (CPU) performs arithmetic processing of control data of musical tone parameters, thus forming an electronic tone according to a given nonlinear function.

However, in the sound source of the conventional electronic musical instrument, since nonlinear function table is set in advance, and is stored in a circuit, a control range of electronic musical tones is limited to the characteristics of the nonlinear table, resulting in a limited electronic tone forming range.

SUMMARY OF THE INVENTION

The present invention has been made in consideration of the conventional drawbacks, and has its object to provide a musical tone control apparatus comprising a nonlinear table forming means which allows an operator or a player to properly set an arbitrary nonlinear function, thus widening a musical tone forming range.

In order to achieve the above object, a musical tone control apparatus according to the present invention comprises a sound source having a delay feedback synthesis means for forming a musical tone signal by performing arithmetic processing of musical tone control data on the basis of a nonlinear table, coordinate designation means capable of designating an arbitrary position, and outputting a coordinate position corresponding to the designated position, coordinate display means for displaying the coordinate position outputted by the coordinate designation means, and table forming means for forming the nonlinear table on the basis of the coordinate position outputted by the coordinate designation means.

The coordinate designation means comprises revising means which revises the designating position, and the coordinate designation means outputs the coordinate position corresponding to the designated and revised position, so that the table forming means forms the nonlinear table suitable for the sound source.

The nonlinear table is expressed by a nonlinear function graph associated with position data corresponding to the coordinate position, and the revising means determines an upper limit of the designating position so that the graph is formed within a predetermined range.

The coordinate position represents two-dimensional data.

The coordinate designation means includes a tablet for designating the arbitrary position.

With the above arrangement, an operator inputs an arbitrary coordinate position using a coordinate input device such as a tablet while observing a screen of a coordinate display device, and a table of a nonlinear function graph is formed on the basis of the input data. An electronic tone is formed on the basis of the new nonlinear table.

DETAILED DESCRIPTION OF THE PREFERRED EMBODIMENT

Figure 1:
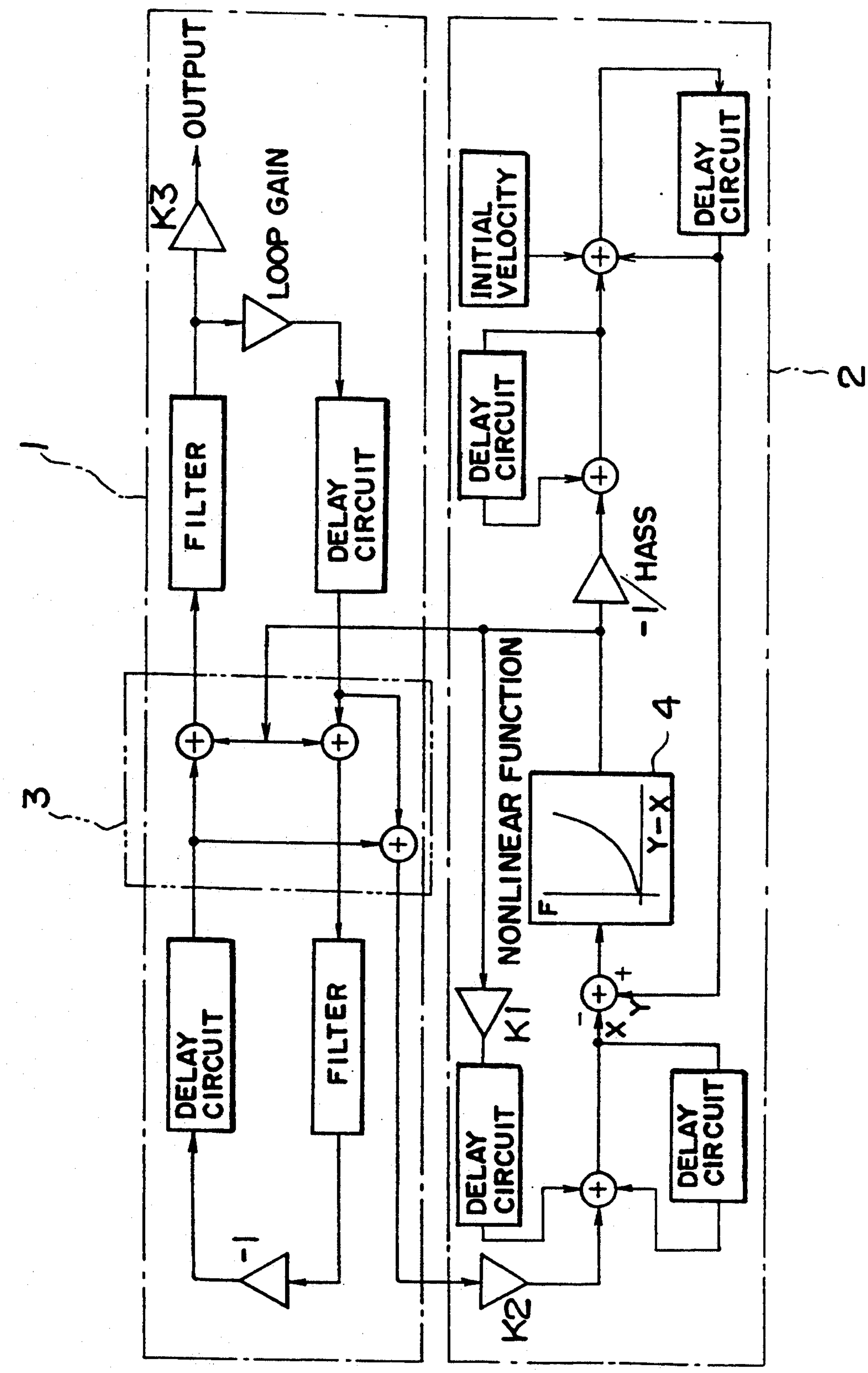
FIG. 1 is a circuit diagram of a sound source to which the present invention is applied.

FIG. 1 is a circuit diagram showing a physical sound source for an electronic musical instrument to which the present invention is applied, and shows a sound source circuit simulating a keyboard instrument such as a piano. An upper circuit 1 in FIG. 1 simulates a piano string (piano wire), and a lower circuit 2 simulates a hammer for hitting the string. The string-side circuit 1 includes a circuit 3, comprising adders, for representing a hit string point, and has filters and delay circuits in correspondence with string portions on two sides of the hit string point, thus generating a signal having a resonance frequency according to the lengths of the string portions. The hammer side circuit 2 has a nonlinear function table 4 representing characteristics of a felt of a hammer. The nonlinear table 4 is expressed by a nonlinear function graph, as shown in, e.g., FIG. 1. In this case, the abscissa corresponds to a biting amount (compression amount) of the felt of the hammer on the string when the hammer hits the string, and the ordinate corresponds to a counterforce at that time. Control input data of a musical tone to be controlled is inputted as an analog signal according to, e.g., a depression amount of an expression pedal, a signal based on a change in resistance according to a manual operation position, or the like. The input data is converted into position data such as a hit string point. Thereafter, a signal according to a hitting force of the hammer is subjected to arithmetic processing on the basis of the characteristics of the nonlinear table 4, and the processed signal is outputted.

Note that the arrangement itself of the sound source circuit is disclosed in U.S. Ser. No. 07/558,059 assigned to the present applicant.

Figure 2:
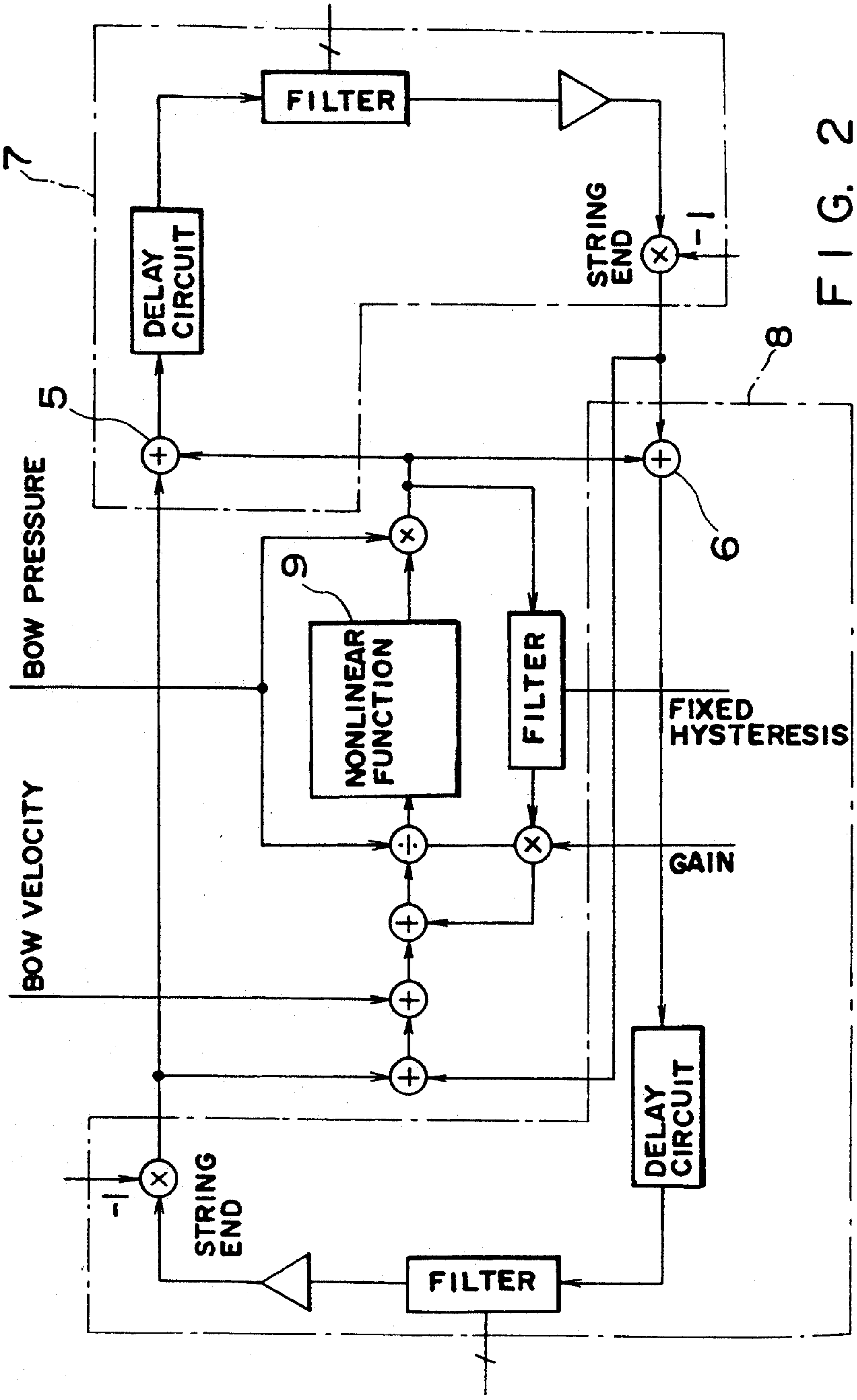
FIG. 2 is a circuit diagram of another sound source to which the present invention is applied.

FIG. 2 shows another sound source comprising a delay feedback circuit having a nonlinear function table. This sound source circuit simulates a bowed instrument. Adders 5 and 6 correspond to a bowed string point by a bow, and circuits 7 and 8 corresponding to string portions on two sides of the bowed string point are formed between multipliers corresponding to string ends (a finger and a bridge). Signals from the two closed loop circuits 7 and 8 are synthesized, and the synthesized signal is input to a nonlinear table 9. A signal is subjected to arithmetic processing in accordance with a nonlinear function pattern, thus outputting a musical tone signal having desired characteristics.

Figure 3:
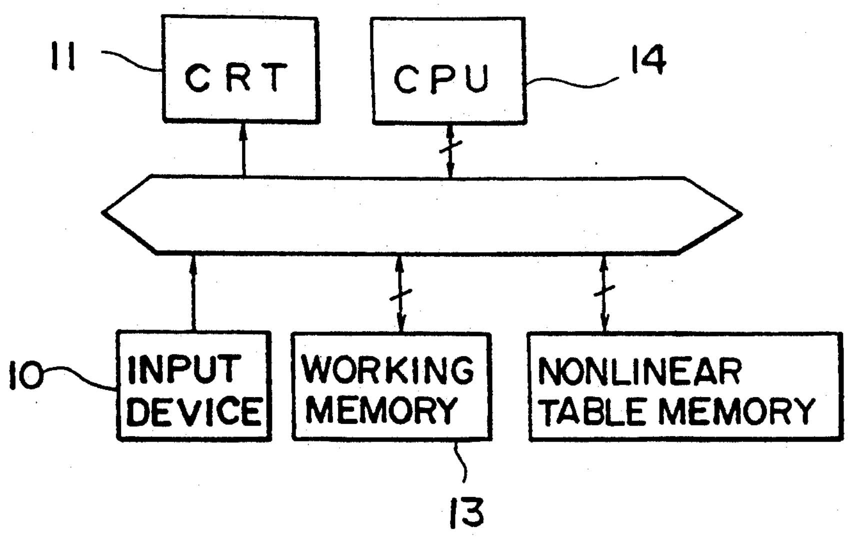
FIG. 3 is a block diagram of a nonlinear table forming apparatus according to the present invention.

In the present invention, an operator can properly rewrite a nonlinear table, and FIG. 3 is a block diagram therefor. A coordinate input device 10 for designating a position on an X-Y plane is connected to a CPU 14 via a bus line. Input coordinate data is displayed on a CRT 11. As the coordinate input device 10, a two-dimensional input device such as a mouse, a light pen, a digitizer, a tablet, or the like is employed. Alternatively, an input device which can obtain two position signals corresponding to X- and Y-coordinates by a joystick mechanism may be employed. The CPU 14 is also connected to a working memory 13 comprising a ROM, A RAM, or the like, and used for various arithmetic processing operations, a nonlinear table memory 12 for temporarily retaining a nonlinear table inputted from the input device 10, and the like.

An operator writes a nonlinear function graph using the input device 10 such as a mouse while observing a screen of the CRT 11. The CPU 14 performs predetermined arithmetic processing based on the input graph to form a musical tone signal.

Figure 4A:
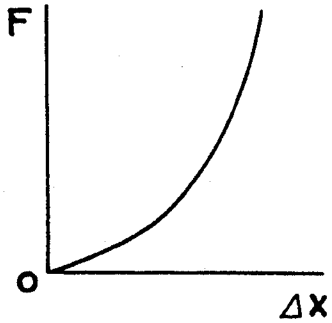
FIGS. 4A and 4B are graphs of nonlinear tables corresponding to compression of a felt of a piano hammer, and a counterforce.
Figure 4B:
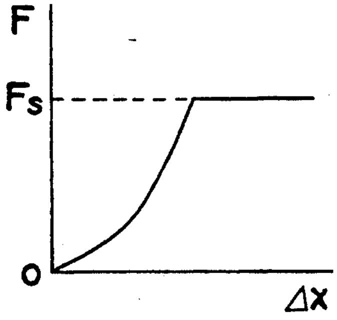

FIG. 4A is a graph showing the relationship between compression of a felt of a piano hammer, and a force at that time. When a compression amount $\Delta x$ of the felt is increased, the elastic coefficient of the felt is increased, and the felt is hardened. Thus, a rate of an increase in force F is increased, and the gradient of the curve is gradually increased. When the graph having such characteristics is used as a nonlinear table, a graph pattern is determined so that an increase in force F is stopped at a given setting value $F_S$, as shown in FIG. 4.

Figure 5A:
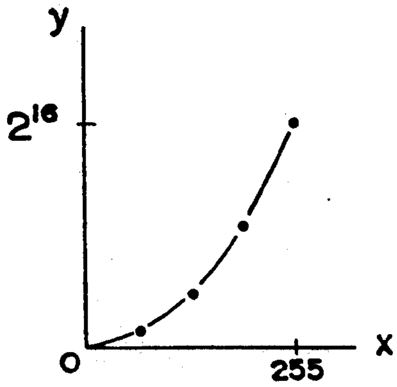
FIGS. 5A and 5B are graphs for explaining nonlinear tables according to the present invention.
Figure 5B:
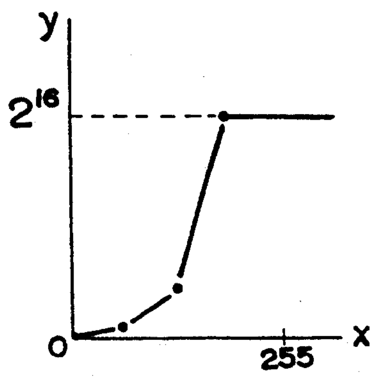

FIGS. 5A and 5B exemplify nonlinear table write operations. Assume that the number of input points is, e.g., 256, and a maximum output value is $2^{16}$. An output for an input "0" is assumed to be "0" to prevent tone generation when a hammer is separated away from the string. Input points are coupled through straight line segments. An upper limit value is $2^{16}$, and when the upper limit value is reached before a position x reaches 256, an output for the following x values is assumed to be $2^{16}$, as shown in FIG. 5B. One y for x is inputted, x values smaller than the latest x cannot be changed.

A table description sequence by the nonlinear table forming apparatus will be described below with reference to the flow charts shown in FIGS. 6 to 10.

Figure 6:
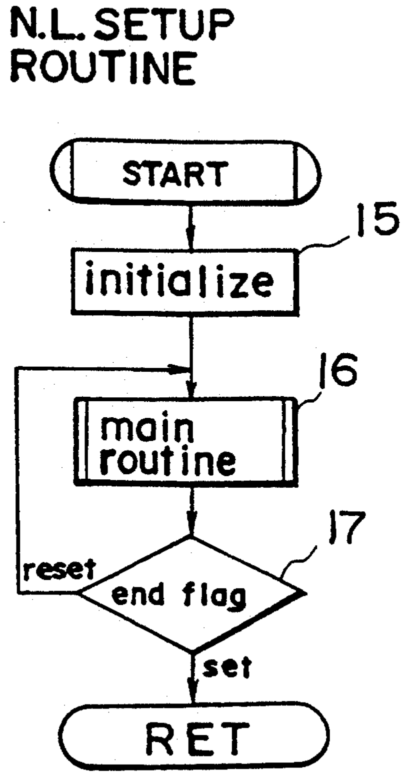
FIGS. 6 to 10 are flow charts showing a nonlinear table forming sequence according to the present invention.

FIG. 6 is a flow chart of a nonlinear table setup routine in the CPU described above. In step 15, initialize processing is executed, and in step 16, a main routine (to be described later) is executed. The main routine in step 16 is repeated until an end detection flag is set in step 17.

In the initialize processing in step 15, a 256×256 area representing a nonlinear table range is drawn on the CRT screen. A mouse cursor is set at coordinates (0, 0) of this area. A nonlinear table is cleared to all "0"s. In addition, data pre.x and pre.y representing previous data values in arithmetic processing are cleared to 0.

Figure 7:
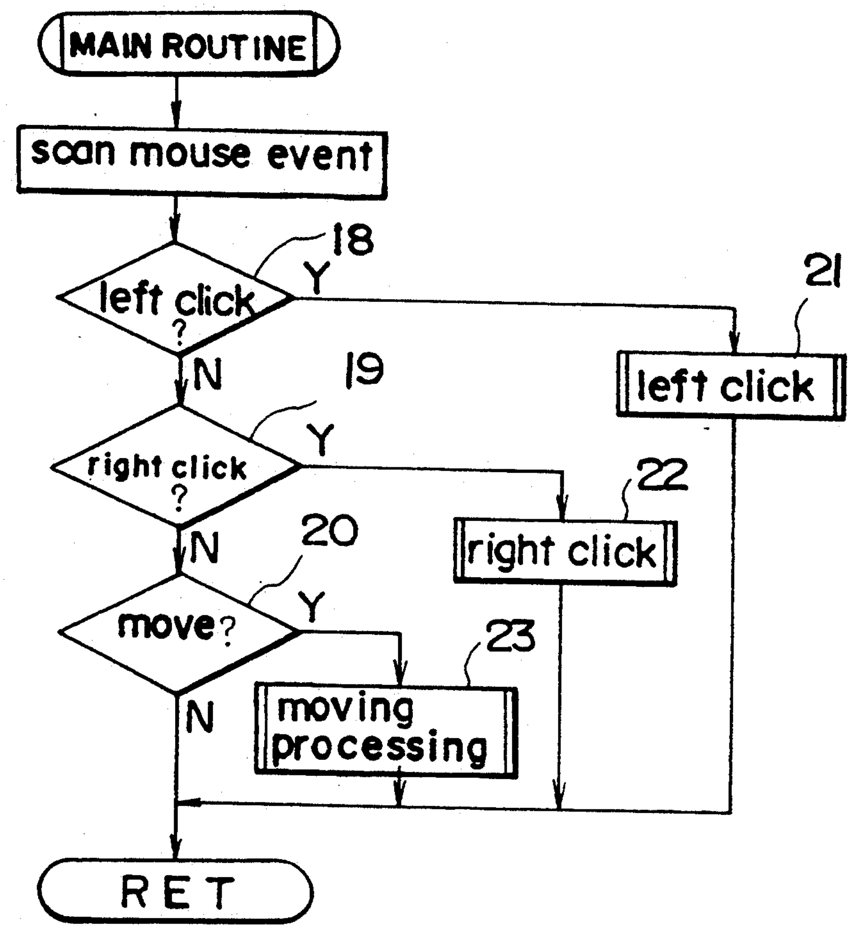

FIG. 7 is a flow chart of the main routine in step 16. In steps 18, 19, and 20, it is checked if a left click button and a right click button of the mouse are depressed, and the mouse is moved. If YES in these steps, left click processing (step 21), right click processing (step 22), and moving processing (step 23) are executed, respectively.

Figure 8:
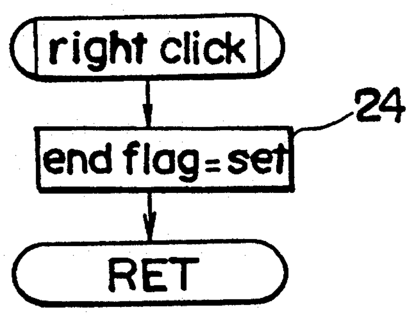

FIG. 8 shows the right click processing in step 22. When the right click button is depressed, the end detection flag is set (step 24), and the main routine is ended.

Figure 9:
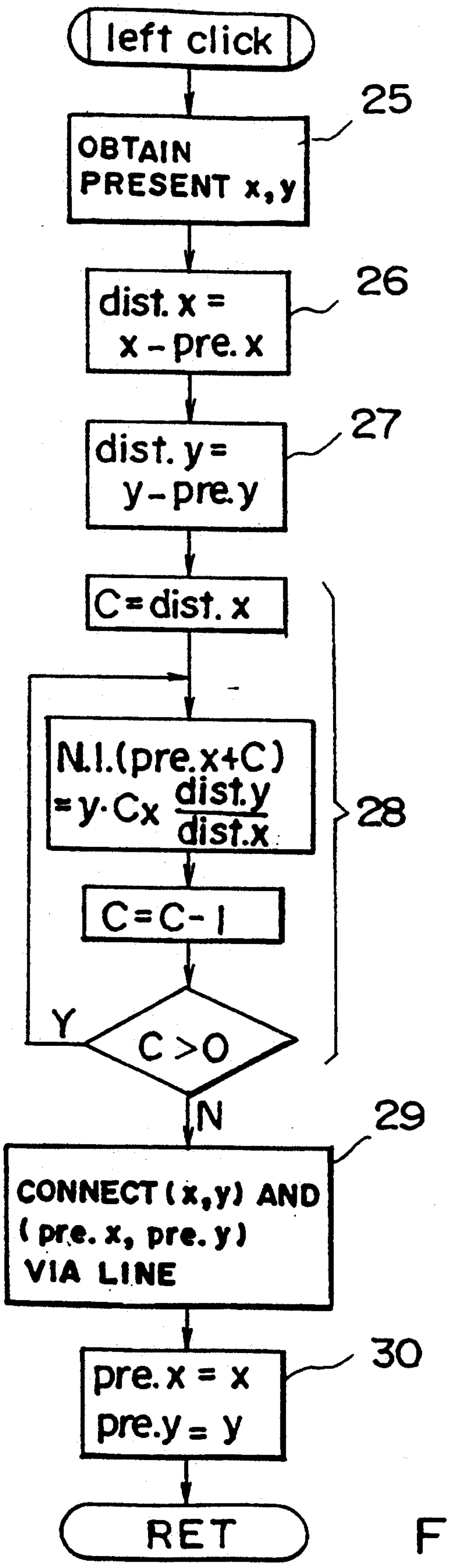

FIG. 9 shows the left click processing in step 21. Present x- and y-coordinate position data are input from the mouse (step 25). In steps 26 and 27, x- and y-displacements of the mouse are obtained, respectively. In FIG. 9, symbols dist.x and dist.y represent x- and y-distances from the previously clicked point to the presently clicked point, and symbols pre.x and pre.y represent coordinate positions of the previously clocked point. Symbol C represents a counter value. In step 28, a straight line for connecting the previously clicked point to the presently clicked point is calculated. This straight line is displayed on the CRT screen in step 29. In FIG. 9, N.L.(X) represents an xth value of an N.L. (nonlinear function), and (x, y) represents a coordinate position on the screen. Finally, present x and y are stored as pre.x and pre.y for the next arithmetic processing (step 30).

Figure 10:
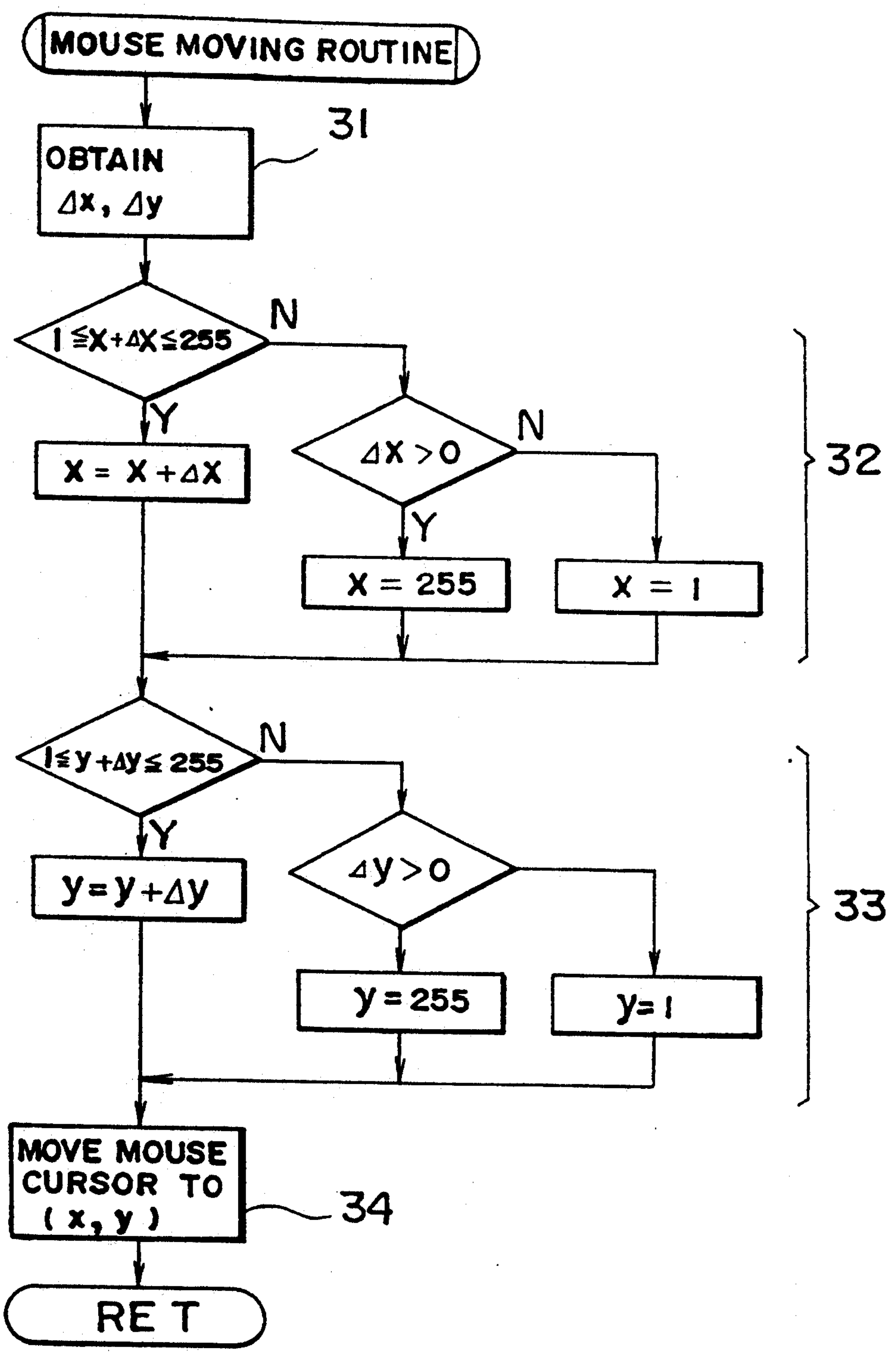

FIG. 10 shows the mouse moving processing routine. In step 31, x- and y-displacements $\Delta x$ and $\Delta y$ of the mouse are calculated. Steps 32 and 33 are routines for causing designated x- and y-coordinates to fall within a 256×256 range. The mouse cursor is moved to a position (x, y) within this range (step 34).

As described above, according to the present invention, since a nonlinear table for determining musical tone characteristics can be arbitrarily set, a musical tone such as a tone color can be properly changed, and a performance in a new tone color can be attained. Since the nonlinear table is inputted not by calculation but by drawing a graph while observing a display screen, an operation is easy, and input table data is simple.

Note that the "nonlinear table" of the present invention is one expressed by a graph of a function for obtaining a predetermined output with respect to a given input, and is widely interpreted to include functions of linear graphs.

The present invention is not limited to the above embodiment, and may be applied to sound sources of algorithms for other bowed instruments, percussions, wind instruments, and the like. The present invention is not limited to a delay feedback type sound source, but may be applied to various other sound sources including nonlinear tables.

What is claimed is:

1. A musical tone control apparatus comprising:

a sound source which has resonance feedback loop means including delay means for delaying input signals according to a pitch of a musical tone to be generated and signal input means including a table having a non-linear input-output characteristic corresponding to a tone color of the musical tone to be generated, for inputting signals based on the input-output characteristic and generates desired musical tones by interaction between the feedback loop means and the signal input means;

coordinate designation means capable of designating an arbitrary position, and outputting a coordinate position corresponding to the designated position;

coordinate display means for displaying the coordinate position outputted by the coordinate designation means; and table forming means for forming the nonlinear table on the basis of the coordinate position outputted by the coordinate designation means.

2. An apparatus according to claim 1, wherein said coordinate designation means comprises revising means which revises the designating position, and the coordinate designation means outputs the coordinate position corresponding to the designated and revised position, so that said table forming means forms the nonlinear table suitable for the sound source.

3. An apparatus according to claim 2, wherein said nonlinear table is expressed by a nonlinear function graph associated with position data corresponding to the coordinate position, and said revising means determines an upper limit of the designating position so that the graph is formed within a predetermined range.

4. An apparatus according to claim 1, wherein said coordinate position represents two-dimensional data.

5. An apparatus according to claim 4, wherein said coordinate designation means includes a tablet for designating the arbitrary position.

* * * * *